United States Patent
Deshayes (10) Patent No.: US 6,356,090 B2
(45) Date of Patent: *Mar. 12, 2002

(54) PROBE TIP CARD FOR THE TESTING OF SEMICONDUCTOR COMPONENTS

(75) Inventor: Herve Deshayes, Puyloubie (FR)

(73) Assignee: STMicroelectronics S.A., Gentilly (FR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/221,220

(22) Filed: Dec. 23, 1998

(30) Foreign Application Priority Data

Dec. 24, 1997 (FR) .............................. 97 16465

(51) Int. Cl.$^7$ .............................................. G01R 31/02
(52) U.S. Cl. .................... 324/754; 324/758; 324/761
(58) Field of Search ................................. 324/754, 761, 324/72.5, 757, 762, 765, 758

(56) References Cited

U.S. PATENT DOCUMENTS

| | | | | |
|---|---|---|---|---|
| 4,423,376 A | * | 12/1983 | Byrnes et al. ............... 324/756 |
| 4,896,107 A | | 1/1990 | Maelzer et al. ............. 324/158 |
| 5,225,777 A | * | 7/1993 | Bross et al. ................. 324/754 |
| 5,399,982 A | * | 3/1995 | Driller et al. ............... 324/754 |
| 5,511,304 A | * | 4/1996 | Aksu ...................... 324/758 X |
| 5,525,911 A | * | 6/1996 | Marumo et al. ............. 324/754 |
| 5,550,480 A | * | 8/1996 | Nelson et al. ............... 324/754 |
| 5,767,692 A | * | 6/1998 | Antonello et al. ........... 324/761 |
| 5,828,226 A | * | 10/1998 | Higgins et al. .............. 324/762 |
| 5,850,148 A | * | 12/1998 | Nam ........................... 324/761 |
| 5,945,838 A | * | 8/1999 | Gallagher et al. ........... 324/761 |
| 5,952,843 A | * | 9/1999 | Vinh .......................... 324/761 |

FOREIGN PATENT DOCUMENTS

| GB | 2 178 604 A | 2/1987 | ........... G01R/1/073 |
|---|---|---|---|
| WO | 97/43655 | 11/1997 | ........... G01R/1/073 |

OTHER PUBLICATIONS

Patent Abstracts of Japan, vol. 018, No. 609, Nov. 18, 1994, and JP 06 230033 A (Toho Denshi KK), Aug. 19, 1994.

* cited by examiner

Primary Examiner—Ernest Karlsen
Assistant Examiner—Minh Tang
(74) Attorney, Agent, or Firm—Lisa K. Jorgenson; Allen, Dyer, Doppelt, Milbrath & Gilchrist, P.A.

(57) ABSTRACT

A probe tip card for enabling testing of components on a semiconductor wafer includes a printed circuit support card and a set of probe tips connected to the printed circuit support card. The probe tips are tilted with respect to the surface of the card and are held in a tilted position between an upper grid and a lower grid. The probe tip card allows for the testing of chips before they are diced from a semiconductor wafer.

42 Claims, 7 Drawing Sheets

# PROBE TIP CARD FOR THE TESTING OF SEMICONDUCTOR COMPONENTS

FIELD OF THE INVENTION

The present invention relates to the field of semiconductor components, and, more particularly, to a probe tip card for testing components on a semiconductor wafer.

BACKGROUND OF THE INVENTION

To reduce manufacturing costs and times, a majority of tests performed on semiconductor components, i.e., integrated circuits and discrete components, are presently carried out directly on the silicon wafers when they come off the production line before the cutting operation. To perform the tests, a tester provides electrical signals to the integrated circuit chips using a probe tip card adapted to their topology. For this purpose, the silicon wafer containing the chips to be tested is moved towards the probe tip card so that the probe tips, or needles, rest on the contact pads provided on the chips. The probe tip card is part of a testing machine. A processor is used for the automatic management of the testing machine. It also provides for the running of the test sequences, the storage of the test results, and the identification of defective chips.

There are three kinds of commonly used probe tip cards. They are manufactured according to three different technologies. These technologies are known as the "cantilever" technology, the "membrane" technology, and the "vertical" technology.

Figure 1A:
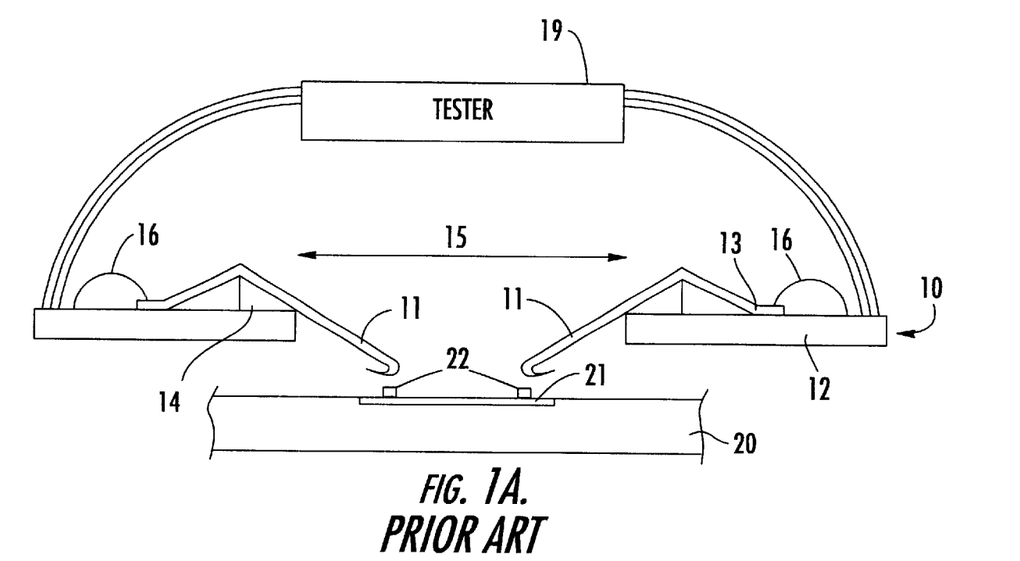
FIGS. 1A and 1B respectively show a sectional view and top view of a "cantilever" probe tip card, according to the prior art.
Figure 1B:
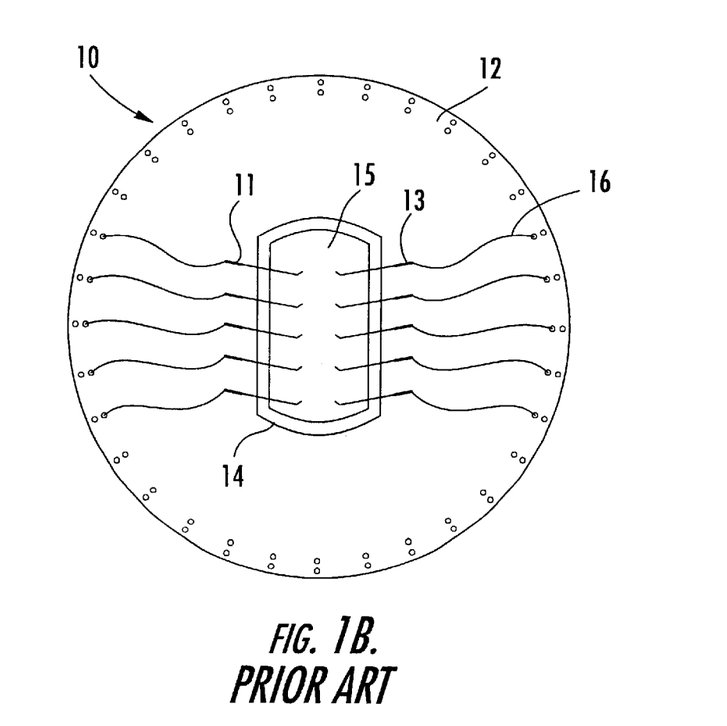

A probe tip card made according to the "cantilever" technology is shown schematically in a sectional view in FIG. 1A, and in a top view in FIG. 1B. A probe tip card 10 of this kind has several needles 11 positioned horizontally, i.e., parallel to the surface of the card, and around a window 15 formed in the center of the probe tip card 10. This type of card is generally connected to an epoxy or ceramic printed circuit support 12. The needles 11 are fixed to the support 12 either by soldering or by bonding with an epoxy adhesive (reference 13). Conductive wires 16 are used for the electrical connection of the needles 11 to the tester 19 by the contacts of the printed circuit.

For greater clarity, only one chip 21 to be tested is shown in the silicon wafer 20 in FIG. 1A. This chip has contacts 22. During the tests, the silicon wafer 20 is moved towards the probe tip card 10 so that the needles 11 are supported on the contact pads 22, and thus provide an electrical contact between the chip 21 and the tester 19 through the probe tip card 10.

The shape of the needles 11 allow for a certain elasticity. A retention ring 14 is used to hold the needles so that they are pointed towards the contacts 22 of the circuit to be tested. Furthermore, the ends of the needles 11 are curved to form a claw. Thus, during the tests, when the contacts 22 of the chips to be tested are pressed against the needles 11 of the probe tip card 10, the pressure provides a side motion of the needles 11. This side motion prompts a clawing effect on the contacts 22. This clawing enables the removal of a surface layer of aluminum oxide that is formed over the contacts 22, and thus enables very high quality electrical contact to be established.

A card of this kind allows for the performance of up to 700,000 tests. However, its cost of manufacture is still quite high. A major drawback related to the use of these probe tip cards 10 is that their handling requires great precautions. The needles 11 exert a large amount of force on the contacts 22 of the chips 21. Care is needed to avoid applying excessive pressure when the chips 21 to be tested and the probe tip card 10 come into contact with each other to avoid damaging the contacts of the chips 21. Such damage could cause the breakage of the passivation layer around the contact pads 22. This deterioration of the contact pads 22 for the chips 21 would present problems since a chip 21 requires tests at different stages of its assembly into modules. Consequently, the number of tests are limited to prevent excessive deterioration of the chip 21 caused by the testing operation itself.

The ends of the needles 11 must be located in the same plane so that each of them can set up an electrical contact with a contact pad 22 of a chip 21 being tested. This planar characteristic may be obtained by working on the shape of the needles 11 after they have been fixed in the probe tip card 10. The trueing, however, is a laborious and lengthy task. Furthermore, this trueing of the needles 11 often deteriorates after the needles 11 have been pressed between the contact pads 22 because they tend to buckle. As a result, constant maintenance is required.

Furthermore, even an accurate trueing of the needles 11 cannot compensate for the significant differences in the heights of the contact pads 22 of the chips 21 being tested. To compensate for these differences, greater pressure would have to be applied to enable a needle 11 to be able to set up contact with a contact pad 22 that is shorter than the others. However, in this case, such pressure would be too excessive and the other contact pads 22, whose height is greater, would be damaged or even rendered unusable. Furthermore, the difficulty of trueing the needles 11 makes the probe tip card 10 practically impossible to repair.

Currently, the chips 21 are being increasingly miniaturized to a size where the space between the contact pads 22 is also reduced. This space is generally in the range of 200 $\mu$m, 150 $\mu$m and even less than 100 $\mu$m. To adapt to current chips and enable several of them to be tested in parallel, the probe tip cards must have inter-tip gaps of the same magnitude. The needles 11 of the cantilever cards have a conical shape with a diameter that is greater at the ends fixed to the support of the printed circuit. It would therefore be difficult to place these needles side by side. Consequently, a card manufactured according to the cantilever technology cannot be used to test several chips in parallel because it is not cost effective.

Figure 2:
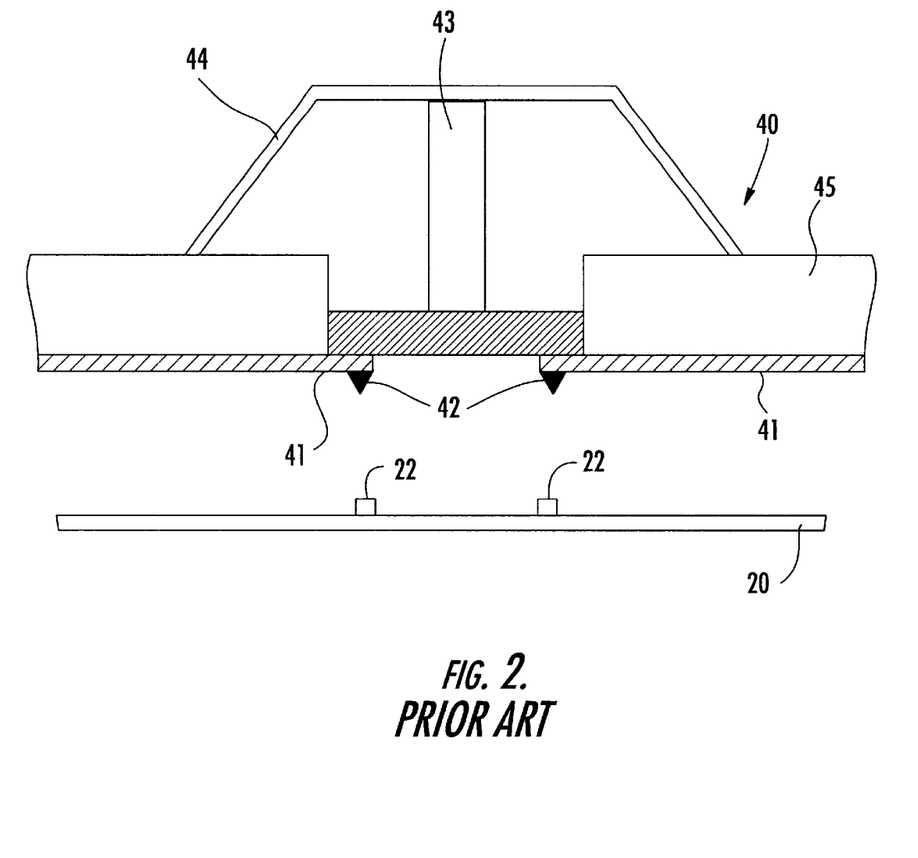
FIG. 2 shows a sectional view of a "membrane" probe tip card, according to the prior art.

A probe tip card made according to the "membrane" technology is schematically shown in a sectional view in FIG. 2. A probe tip card 40 of this kind has a flexible printed circuit 41, also called a membrane, fixed to a rigid ring support 45. Metal bosses 42 are made on the flexible printed circuit 41. A bias is maintained on the membrane 41, for example, by a spring 43 held by a lid 44. An electrical contact is set up between the bosses 42 and the contact pads 22 of the chips to be tested when pressure is applied to the silicon wafer 20.

However, to enable constant voltage to be maintained between the metal bosses 42, the dimensions of the membrane 41 must be limited. Furthermore, because of the significantly large size of the bosses 42, the spacing between the bosses 42 cannot be reduced sufficiently to adapt to the small size of current chips. Consequently, the membrane type cards cannot be used to test several chips in parallel. Furthermore, the bosses 42 are all connected to one another by the membrane in such a way that they are not independent. The motion of one boss 42 causes the motion of neighboring bosses 42. The membrane furthermore has great flexibility so that it is very difficult to maintain tension so that the bosses 42 are all parallel and located in one and the same plane. This type of card therefore does not make it possible to easily compensate for the significant differences in height between the contact pads.

Finally, forming a probe tip card of this kind is very costly. Furthermore, given that the metal bosses 42 are made by deposition directly on the flexible printed circuit 41, they cannot be interchanged and the card can not be repaired. Finally, the lifetime of this type of card is fairly limited since it allows for only about 250,000 tests to be performed.

A probe tip card made according to vertical technology has needles positioned vertically, i.e., perpendicular to the surface of the card. Two types of cards are presently being made according to this vertical technology. One is the "cobra" card schematically shown in a sectional view of FIG. 3A and the other one is the buckling beam card, schematically shown in FIG. 3B. FIG. 3C provides a schematic top view of one of these probe tip cards made according to the vertical technology for the testing of several chips in parallel.

In these two types of probe tip cards formed according to vertical technology, the probe tips are very thin so that they can be juxtaposed in large numbers. The space between the probe tips may therefore be small enough for the cards to be adapted to the size of current chips. The cards made according to the vertical technology therefore enable tests to be carried out on several chips 21 in parallel, as illustrated in the top view of FIG. 3C. The vertical technology furthermore allows for the cards to be easily repaired since each tip may be replaced independently of the others.

Figure 3A:
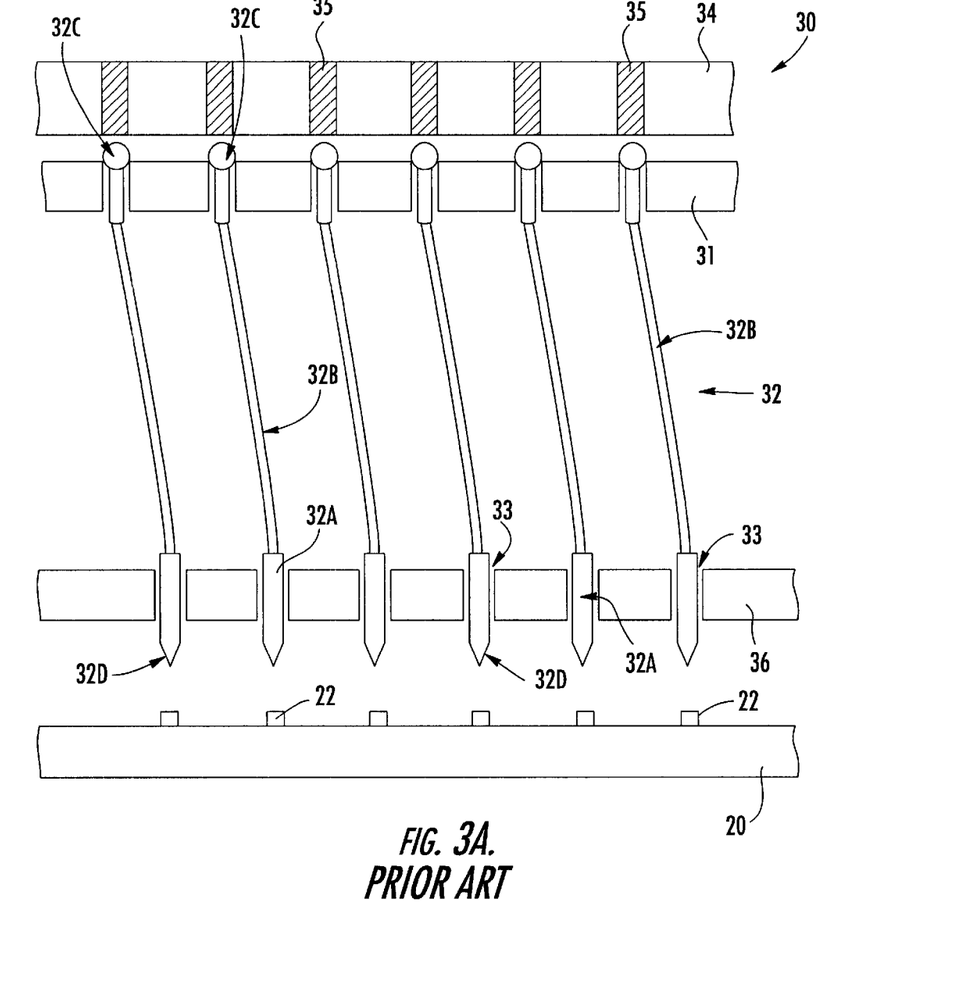
FIGS. 3A, 3B and 3C respectively show a sectional view of a "cobra" probe tip card, a sectional view of a "buckling beam" probe tip card, and a top view of these cards, according to the prior art.

The "cobra" card referenced 30 in FIG. 3A includes probe tips 32 that are held vertically between two screens or grids 31, 36. Vertical holes 33 are formed in the lower grid 36 to receive the probe tips 32 therein. The diameter of the holes 33 is wide enough to enable the probe tips 32 to slide vertically. However, the probe tips 32 may become wedged in the screen 36. The smaller the diameter of the probe tips 32, the more difficult is it to form them into shape. The shape of the probe tips 32 are rounded in a first part 32A corresponding to the sliding zone in the holes 33 of the lower grid 36. They are flattened in a second part 32B located between the two grids 31 and 36 to give the probe tips a better spring effect. The probe tips 32 are also formed into a bead shape in a third part 32C called a head, which is located in the upper part of the upper grid 31.

This type of card is generally made on an epoxy or ceramic printed circuit support 34. Holes are formed in this printed circuit support 34 and are each filled with a conductive wire 35 machined and bonded so that it is flush with the surface of the support 34. The wire 35 is lightly gold-plated to allow efficient electrical contact with the probe tips 32. In this type of cobra card, the probe tips are floating. Whenever a pressure is applied to the silicon wafer to press the contact pads 22 against the probe tips 32, each tip is urged against a wire 35. In other words, the head 32C of each tip touches the surface of the gold-plated wire 35 to set up an electrical contact. An hammer effect occurs on the conductive wire 35 and causes the gold-plating of the wire 35 to be dug out. Consequently, the gold-plating of the wires should be repeated very often. This hammer effect is the major drawback of the cobra cards because it considerably reduces their lifetime, which is about 200,000 to 300,000 tests.

Furthermore, in this type of card, the probe tips 32 do not move horizontally, but move vertically so that there is no clawing effect. This clawing effect is necessary to remove the aluminum oxide layer formed on the contact pads 22 of the chips and thus establish a high-quality electrical contact. Consequently, to enable penetration into the oxide layer, the probe tips 32 should have a very pointed end 32D. Furthermore, the probe tips 32 do not have a high heat dissipation. If the current applied to the probe tips 32 intensifies, the probe tips 32 become heated. Since they are surrounded by air, they poorly dissipate heat. Even the holes 33 of the lower grid 36 poorly dissipate the heat.

Figure 3B:
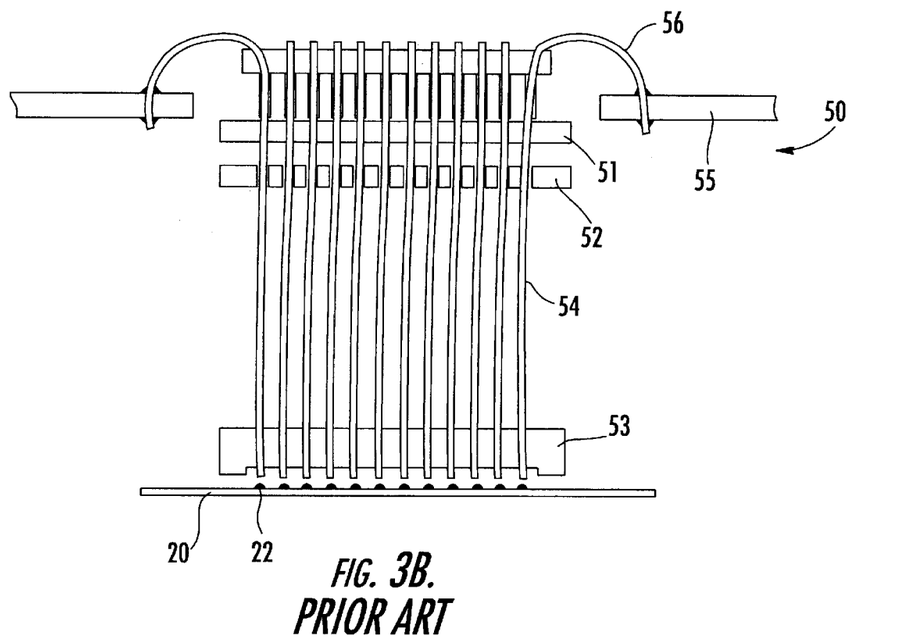
Figure 3C:
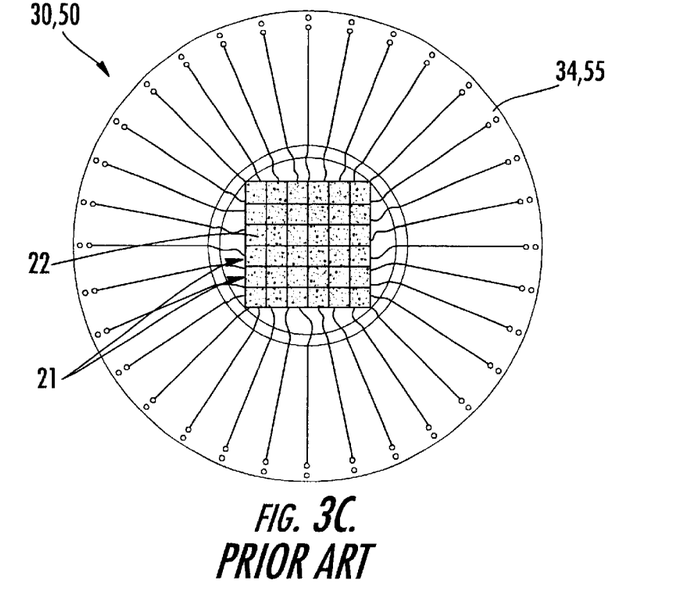

The card known as the buckling be am card, as referenced 50 in FIG. 3B, has probe tips 54 that are held vertically between three grids 51, 52, 53. In this case, the shape of the probe tips is not formed as in the case of the cobra card, but the probe tips 54 are preformed by the additional grid 52. Furthermore, the probe tips 54 are not floating tips. They are in permanent contact with wires 56 connected to the support of the printed circuit 55. Consequently, the hammer effect is avoided and the lifetime is therefore slightly longer than it is for the cobra card. The buckling beam card enables the performance, on an average, of up to 500,000 tests.

However, at the time of the tests, when pressure is applied to the silicon wafer 20 to set up a contact between the probe tips 54 and the contact pads 22, the probe tips buckle. There is now a major risk that they will touch one another and thus cause a short circuit. Furthermore, the ends of the probe tips 42 have to be very pointed to enable the penetration of the oxide layer covering the contact s to form an electrical contact.

SUMMARY OF THE INVENTION

An object of the invention is provide a probe tip card that overcomes the above-mentioned drawbacks related to the different technologies of the prior art. The probe tip card is used to test semiconductor components, while having an efficient compromise among all the conditions to be fulfilled in the requirements. The probe tip card, in particular, must have a high degree of flatness at the ends of the probe tips, high physical independence of the probe tips, and an overall but controlled vertical flexibility. Additional requirements include having a clawing effect to enable the removal of the surface layer of aluminum oxide overlapping the contact pads of the circuits being tested, and establishing a high quality electrical contact. The space between the probe tips must be small enough for them to adapt to the miniaturization of the chips, and it must enable the parallel testing of several chips. The probe tip card should furthermore be easy to repair, have a long lifetime, i.e., allow for one million or more tests, and be a low-cost device.

To meet all these criteria, the present invention provides a probe tip card for the testing of components on a semiconductor wafer comprising a printed circuit support card and a set of probe tips connected to the printed circuit support card. The tips are tilted with respect to the surface of the card and held in this tilted position between an upper grid and a lower grid. The tilting of the probe tips provides the card and the tips great flexibility. Each tip is shifted slightly laterally when a contact pad of a chip to be tested comes into contact with it so that a clawing effect forms a high-quality electrical contact. Due to the fact that there is a spring effect and a clawing effect of the probe tips, it is not necessary to work or form the shape of the tips. This significantly simplifies making the probe tip card.

BRIEF DESCRIPTION OF THE DRAWINGS

Other characteristics and advantages of the invention shall appear from the following description, given by way of a non-restrictive indication and made with reference to the appended drawings, of which.

DETAILED DESCRIPTION OF THE PREFERRED EMBODIMENTS

Figure 4:
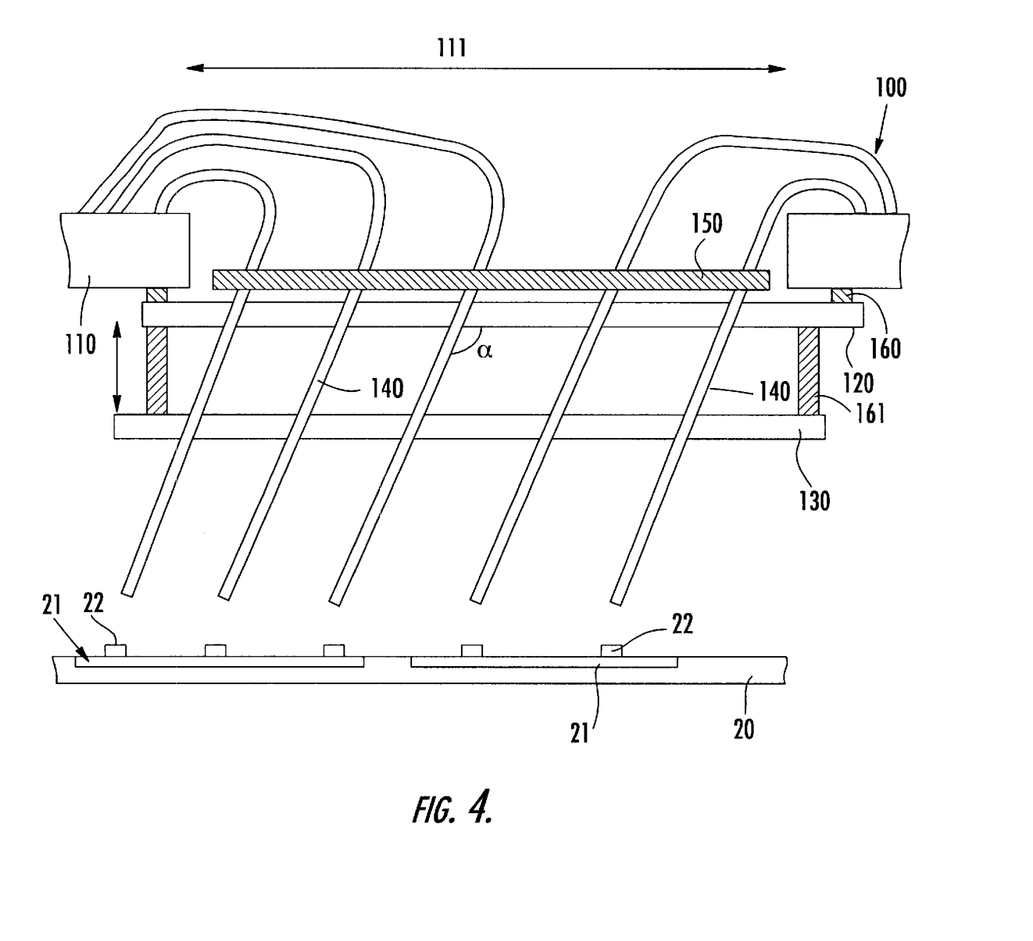
FIG. 4 shows a sectional view of a probe tip card, according to the present invention.

FIG. 4 shows a sectional view of a probe tip card 100 according to the present invention. The probe tip card 100 is made on an epoxy or ceramic printed circuit support 110 at the center of which is hollowed out a window 111 for the positioning therein of a set of probe tips 140. Advantageously, the probe tips 140 are positioned in a tilted position with respect to the surface of the card and are held in this position to be tilted between two grids 120 and 130.

The angle of tilt α between the probe tips 140 and the surface of the probe tip card 100 ranges from 25° to 40°. Preferably, the angle is in the range of 30° to 33°. This tilt can be used to obtain a spring effect on the probe tips 140 and high flexibility of the probe tip card 100. The probe tips 140 are formed, for example, by tungsten wires. As shown in FIG. 4, these wires 140 may be directly connected and attached to the integrated circuit support card 110, either by soldering or by bonding using an epoxy adhesive. They are furthermore attached to the upper grid 120 using a layer 150 of epoxy adhesive.

Figure 5:
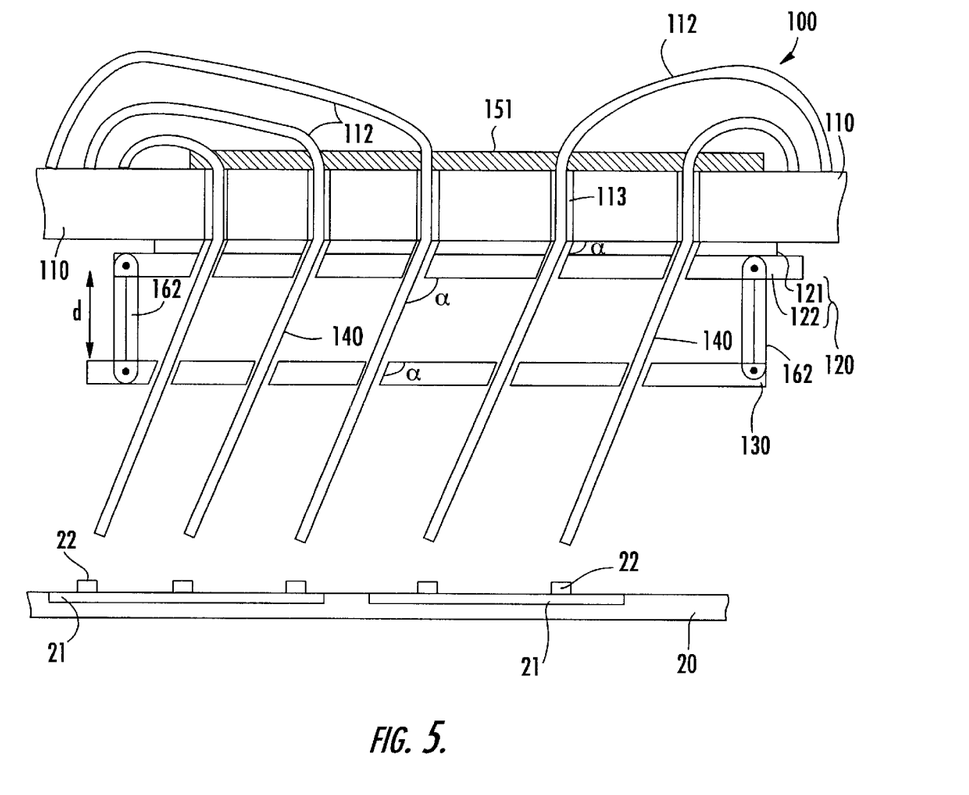
FIG. 5 shows a sectional view of a probe tip card according to another embodiment of the present invention.

To attach the probe tips 140, preference is given to the embodiment shown in FIG. 5 because it allows for easier repairs. This embodiment allows for a simple and fast replacement of a tip when it is worn out, and is done independent of the other probe tips 140. This system of attaching includes cutting the metal wires 140 flush with the upper surface of the upper grid 120. The upper grid 120 actually includes two parts 121, 122. The probe tips 140 are threaded into holes made in the two parts 121, 122 of the upper grid. Then they are attached to the grid 120 through the lateral shifting of one of the two parts 121 or 122 with respect to the other. In another embodiment, it is also possible to provide for the attaching of the probe tips by moving both parts 121, 122 laterally in directions opposite to each other.

The probe tips 140 are then connected to the printed circuit support card 110 using conductive wires 112 which are positioned above the ends of the tips to make contact, and are held in their position using an epoxy adhesive 151. In this case, the locking of the two parts 121, 122 of the grid, in their tip-fixing position, will be improved by a system of projections that are fitted into a system of hollows. In this embodiment, the card can very easily be repaired since each tip can be replaced swiftly and independently of the others.

Furthermore, an intermediate part 114 (see FIG. 6) comprising vertical holes 113 designed to receive the conductive wires 112 can be attached by an adhesive or by a mechanical system to the printed circuit support 110. The intermediate part 114 is made of ceramic, for example.

In another alternative embodiment, it is not necessary to hollow out a window 111 in the center of the printed circuit support 110 to place the probe tips or an intermediate part 114 therein. It is sufficient, as shown in FIG. 5, to hollow out vertical holes 113 in the printed circuit support 110. The vertical holes are designed to receive the conductive wires 112. The grids 120 and 130 are drilled with holes inclined at the same angle α as that of the tilt of the probe tips 140 with respect to the surface of the grid. Furthermore, the thickness of the grids 120 and 130 is about 800 μm.

The probe tips have a length of about 3.5 to 30 mm and a diameter of 50 to 100 μm. Naturally, these dimensions depend on the space required between the probe tips, the intensity of the current used, and the power drawn to carry out the tests. The card according to the invention adapts very well to the size of current chips since the probe tips may be spaced out by a small value of 200 μm, 150 μm or even less than 100 μm. This spacing value also depends on the diameter of the tips.

The distance d between the upper grid 120 and the lower grid 130 makes it possible to manage the spring effect of the card. The greater this distance, the greater is the spring effect of the card, but the less flexible and independent are the ends of the probe tips 140. In contrast, when the lower grid 120 is raised, i.e., when the distance d decreases and the free end of the probe tips 140 increases, the total spring effect of the card decreases while the probe tips 140 are highly flexible and independent of one another. Consequently, the distance d between the two grids is adjusted to obtain an efficient compromise between the overall flexibility of the card and the elasticity and independence of the probe tips. This distance d ranges from 5 to 20 mm, for example.

To perform the tests, it is sufficient to bring the silicon wafer 20, supporting several chips 21, close to the probe tip card 100. The contact pads 22 of the chips 21 come into contact with the probe tips 140. Under the effect of the pressure applied, i.e., also depending on the height of the pads 22, the probe tips 140 are tilted. During this tilting, the probe tips 140 slightly claw the surface of the pads 22. This enables the removal of the aluminum oxide layer that covers the pads and for making electrical contact. Furthermore, the pressure applied is well controlled. It is significantly lower than in the case of horizontally positioned probe tips so that the clawing effect is light enough to prevent an excessively rapid deterioration of the contact pads 22 of the chips 21.

Furthermore, since the probe tips 140 are not floating, but are in permanent contact with the printed circuit support 110, there is no hammer effect. This means that the lifetime of the card is increased so that it is greater than that of a cobra type card. Furthermore, in the card according to the invention, the probe tips 140 do not slide, unlike the cobra and buckling beam cards manufactured according to the vertical technology. As a result, any risk of wedging is avoided and the lifetime is further increased. This lifetime corresponds to a number of tests greater than one million.

Furthermore, the probe tips 140 of the card according to the invention are perfectly aligned and parallel so that there is a significantly reduced risk of their touching each other and creating short-circuits. Their ends are located in one and the same plane. This characteristic of flatness is easy to adjust since the probe tips are rectilinear, have the same length, and are all parallel to one another. Since the probe tips are highly flexible and independent of one another, they enable efficient compensation for the significant differences in height of the contact pads 22. Thus, if a pad is higher than the others, the tip 140 in contact with this pad will be more tilted than the other probe tips.

Preferably, there is a clearance between the walls of the holes of the lower grid 130 and the probe tips 140 to leave the probe tips free. This enables them to tilt, especially when compensating for the differences in height of the pads. Thus, since the probe tips have a diameter of 50 $\mu$m to 100 $\mu$m, the holes formed in the lower grid 130 have, for example, a diameter of 60 $\mu$m to 105 $\mu$m. However, despite the existence of this clearance between the holes of the lower grid 130 and the probe tips 140, the probe tips are always in contact with this grid. Consequently, the grid enables an improvement in the heat dissipation of the probe tips 140. This improvement in the heat dissipation also contributes to an increase in the lifetime of the card. Since the probe tips are subjected to overheating, they become worn out more slowly than in the standard vertical structures. The lower grid 130 and the upper grid 120 are made of a ceramic material, for example.

Figure 6:
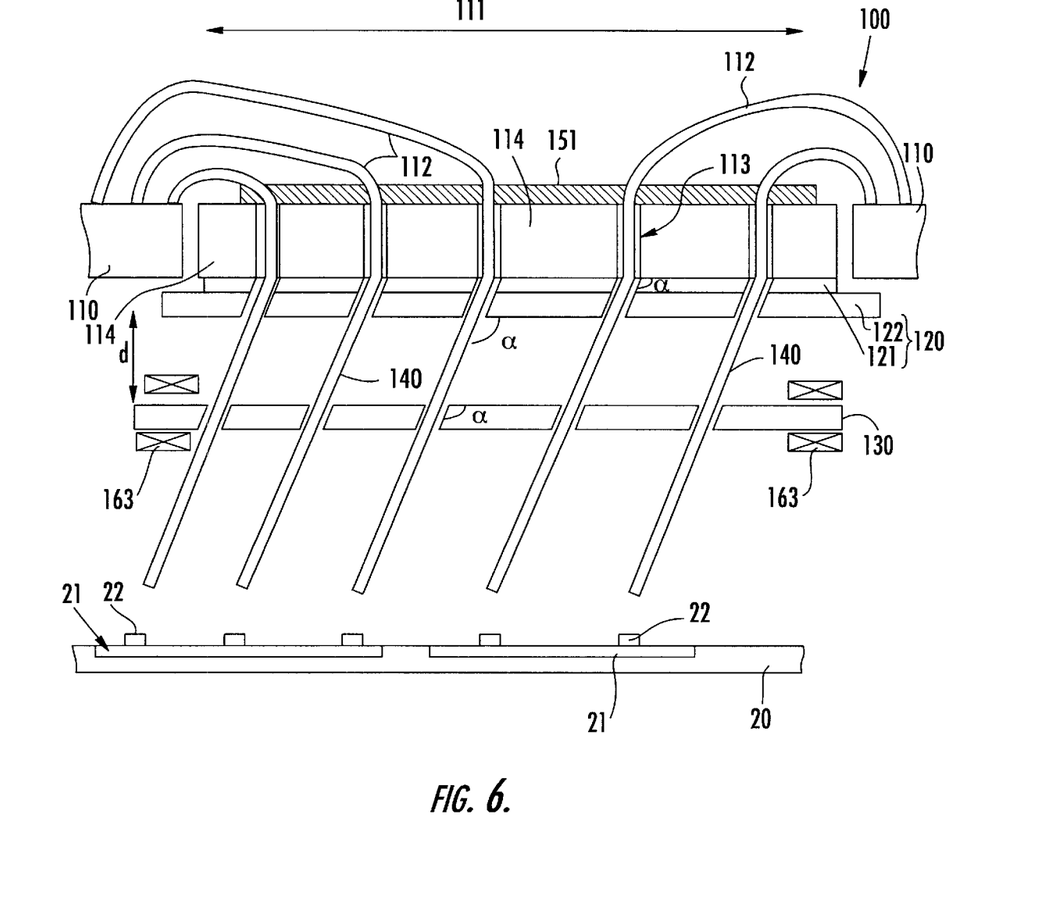
FIG. 6 shows a sectional view of a probe tip card according to yet another embodiment of the present invention.

Preferably, the upper grid 120 or one of its parts 121 or 122 is attached to the printed circuit support card 110 using a layer of epoxy adhesive 160 or is mechanically attached. Attaching of the lower grid 130 can be done according to different variations as shown in the drawings of FIGS. 4 through 6. In a first embodiment, the lower grid 130 is attached either to the upper grid 120 or to the printed circuit support card 110 by a flexible attachment 161 (FIG. 4).

In a second embodiment illustrated in FIG. 5, the lower grid 130 is attached at the upper grid 120 or at the printed circuit support card 110 by a swing rod system 162. In this case, the grid is kept parallel to the direction of shift of the probe tips, i.e., in a horizontal position. It can furthermore be planned that, in this case, the length of the swing rod system 162 is adjustable and makes it possible to control the distance d between the two grids to control the spring effects of the card and of the probe tips.

Another embodiment shown in FIG. 6 includes a lower grid 130 placed so that it is held by a groove element 163. In this case, the lower grid is held vertically in the groove of the part 163 to prevent it from shifting vertically towards the upper grid 120 or towards the silicon wafer 20. However, it is preferable to leave a clearance of about a 100 $\mu$m. This grooved part 163 is furthermore held in position by being mechanically fastened or bonded to the printed circuit support 110 or the upper grid 120. This fastening is not shown in FIG. 6.

Through the card according to the invention, it is not necessary to work or form the shape of the probe tips. The flexibility, or elasticity, of the probe tips is obtained by their tilt to the surface of the card. The card according to the invention is simple to make. It costs very little, has a long lifetime and enables the parallel testing of a large number of chips.

That which is claimed is:

1. A probe tip card for testing components on a semiconductor wafer, the probe tip card comprising:
    a printed circuit support card;
    a plurality of spaced apart grids; and
    a plurality of probe tips connected to said printed circuit support card and having straight portions extending through said grids, all of said plurality of probe tips being oriented and held in a same tilted position with respect to a surface of said printed circuit support card by said grids.

2. A probe tip card according to claim 1, wherein said plurality of spaced apart grids are flexibly connected together.

3. A probe tip card according to claim 1, further comprising a swing rod system connecting said grids.

4. A probe tip card according to claim 1, further comprising a groove element for holding in position one of said grids.

5. A probe tip card according to claim 1, wherein said grids are substantially parallel to each other and to said printed circuit support card.

6. A probe tip card according to claim 1, wherein an angle of tilt of said probe tips is in a range of about 25° to 40°.

7. A probe tip card according to claim 1, wherein each of said probe tips has a length in a range of about 3.5 mm to 30 mm.

8. A probe tip card according to claim 1, wherein each of said probe tips comprises a metal wire having a first end connected to said printed circuit support card and having respective portions adhesively attached to said grids.

9. A probe tip card according to claim 1, wherein one of said grids comprises:
    a first part and a second part; and
    wherein each of said probe tips has respective portions attached to the one of said grids by a lateral shifting of one of said first and second parts with respect to the other, or by both moving said first and second parts laterally in directions opposite to each other.

10. A probe tip card according to claim 1, wherein one of said grids has a plurality of holes therein tilted at a same angle of tilt as said probe tips, each of the holes having a first diameter, and wherein said probe tips have a second diameter less than the first diameter.

11. A probe tip card according to claim 10, wherein the first diameter is in a range of about 60 $\mu$m to 105 $\mu$m, and wherein the second diameter is in a range of about 50 $\mu$m to 100 $\mu$m.

12. A probe tip card according to claim 1, wherein said grids comprise first and second grids having a spacing therebetween in a range of about 5 mm to 20 mm.

13. A probe tip card for testing components on a semiconductor wafer, the probe tip card comprising:
    a printed circuit support card;
    a plurality of spaced apart grids connected together; and
    a plurality of probe tips connected to said printed circuit support card and having straight portions extending through said grids, all of said plurality of probe tips being oriented and held in a same tilted position in a range of about 25° to 40° with respect to a surface of said printed circuit support card by said grids.

14. A probe tip card according to claim 13, wherein said grids are flexibly connected together.

15. A probe tip card according to claim 13, further comprising a swing rod system connecting said grids.

16. A probe tip card according to claim 13, further comprising a groove element for holding in position one of said grids.

17. A probe tip card according to claim 13, wherein said grids are substantially parallel to each other and to said printed circuit support card.

18. A probe tip card according to claim 13, wherein each of said probe tips has a length in a range of about 3.5 mm to 30 mm.

19. A probe tip card according to claim 13, wherein each of said probe tips comprises a metal wire having a first end connected to said printed circuit support card and having respective portions adhesively attached to said grids.

20. A probe tip card according to claim 13, wherein one of said plurality of spaced apart grids comprises:

a first part and a second part; and wherein each of said probe tips has respective portions attached to the one of said grids by a lateral shifting of one of said first and second parts with respect to the other, or by both moving said first and second parts laterally in directions opposite to each other.

21. A probe tip card according to claim 13, wherein one of said grids has a plurality of holes therein tilted at a same angle of tilt as said probe tips, each of the holes having a first diameter, and wherein said probe tips have a second diameter less than the first diameter.

22. A probe tip card according to claim 21, wherein the first diameter is in a range of about 60 $\mu$m to 105 $\mu$m, and wherein the second diameter is in a range of about 50 $\mu$m to 100 $\mu$m.

23. A probe tip card according to claim 13, wherein said grids comprise first and second grids having a spacing therebetween in a range of about 5 mm to 20 mm.

24. A method for testing components on a semiconductor wafer using a probe tip card, the method comprising the steps of:

providing a probe tip card comprising a printed circuit support card, a plurality of spaced apart grids, and a plurality of probe tips connected to the printed circuit support card and having straight portions extending through the grids, all of the plurality of probe tips being oriented and held in a same tilted position with respect to a surface of the printed circuit support card by the grids;

forming an electrical connection between the probe tips and the components; and providing electrical signals to test the components.

25. A method according to claim 24, wherein the components comprises contact pads; and the step of forming an electrical contact further comprises the step of applying pressure on the probe tips so that they are tilted with respect to a surface of the components and the probe tips claw a surface of the contact pads for removing an oxide layer.

26. A method according to claim 24, wherein an angle of tilt of the probe tips is in a range of about 250 to 40°.

27. A method according to claim 24, wherein each of the probe tips has a length in a range of about 3.5 mm to 30 mm.

28. A method according to claim 24, wherein each of the probe tips comprises a metal wire having a first end connected to the printed circuit support card and having respective portions adhesively attached to the grids.

29. A method according to claim 24, wherein one of the grids has a plurality of holes therein tilted at a same angle of tilt as the probe tips, each of the holes having a first diameter, and wherein the probe tips have a second diameter less than the first diameter.

30. A method according to claim 24, wherein the grids comprise first and second grids having a spacing therebetween in a range of about 5 mm to 20 mm.

31. A probe tip card for testing components on a semiconductor wafer, the probe tip card comprising:

a printed circuit support card;

a plurality of spaced apart grids; and a plurality of probe tips connected to said printed circuit support card and having straight portions extending through said grids, said grids being laterally offset to orient and hold all of the plurality of probe tips in a same tilted position with respect to a surface of said printed circuit support card.

32. A probe tip card according to claim 31, wherein said plurality of spaced apart grids are flexibly connected together.

33. A probe tip card according to claim 31, further comprising a swing rod system connecting said grids.

34. A probe tip card according to claim 31, further comprising a groove element for holding in position one of said grids.

35. A probe tip card according to claim 31, wherein said grids are substantially parallel to each other and to said printed circuit support card.

36. A probe tip card according to claim 31, wherein an angle of tilt of said probe tips is in a range of about 25° to 40°.

37. A probe tip card according to claim 31, wherein each of said probe tips has a length in a range of about 3.5 mm to 30 mm.

38. A probe tip card according to claim 31, wherein each of said probe tips comprises a metal wire having a first end connected to said printed circuit support card and having respective portions adhesively attached to said grids.

39. A probe tip card according to claim 31, wherein one of said grids comprises:

a first part and a second part; and wherein each of said probe tips has respective portions attached to the one of said grids by a lateral shifting of one of said first and second parts with respect to the other, or by both moving said first and second parts laterally in directions opposite to each other.

40. A probe tip card according to claim 31, wherein one of said grids has a plurality of holes therein tilted at a same angle of tilt as said probe tips, each of the holes having a first diameter, and wherein said probe tips have a second diameter less than the first diameter.

41. A probe tip card according to claim 40, wherein the first diameter is in a range of about 60 $\mu$m to 105 $\mu$m, and wherein the second diameter is in a range of about 50 $\mu$m to 100 $\mu$m.

42. A probe tip card according to claim 31, wherein said grids comprise first and second grids having a spacing therebetween in a range of about 5 mm to 20 mm.

* * * * *

UNITED STATES PATENT AND TRADEMARK OFFICE
CERTIFICATE OF CORRECTION

PATENT NO. : 6,356,090 B2  Page 1 of 1
DATED : March 12, 2002
INVENTOR(S) : Herve Deshayes It is certified that error appears in the above-identified patent and that said Letters Patent is hereby corrected as shown below:

Column 3,
Line 39, delete "is it" insert -- it is --
Line 58, delete "An hammer" insert -- A hammer --

Column 4,
Line 27, delete "contact s" insert -- contacts --

Column 9,
Line 45, delete "250" insert -- 25° --

Signed and Sealed this

Sixth Day of August, 2002

Attest:

JAMES E. ROGAN
Attesting Officer  Director of the United States Patent and Trademark Office

UNITED STATES PATENT AND TRADEMARK OFFICE
CERTIFICATE OF CORRECTION

PATENT NO. : 6,356,090 B1
DATED : March 25, 2003
INVENTOR(S) : Walter McRae Franklin III, David A. Hooke and John A. Klostermann It is certified that error appears in the above-identified patent and that said Letters Patent is hereby corrected as shown below:

Column 3,
Line 1, after "graphite/epoxy." please delete remaining lines of paragraph.

Signed and Sealed this

Sixth Day of May, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,356,090 B2
DATED : March 12, 2002
INVENTOR(S) : Herve Deshayes It is certified that error appears in the above-identified patent and that said Letters Patent is hereby corrected as shown below:

This certificate supersedes Certificate of Correction issued May 6, 2003, the number was erroneously mentioned and should be vacated since no Certificate of Correction was granted.

Signed and Sealed this

Twenty-eighth Day of June, 2005

JON W. DUDAS
*Director of the United States Patent and Trademark Office*